United States Patent [19]

Zabler et al.

[11] Patent Number: 5,415,043
[45] Date of Patent: May 16, 1995

[54] ACCELERATION SENSOR AND PROCESS FOR ITS PRODUCTION

[75] Inventors: Erich Zabler, Stutensee; Johannes Widder, Karlsruhe, both of Germany

[73] Assignee: Robert Bosch GmbH, Stuttgart, Germany

[21] Appl. No.: 190,144

[22] PCT Filed: Jul. 14, 1992

[86] PCT No.: PCT/DE92/00573
§ 371 Date: Feb. 4, 1994
§ 102(e) Date: Feb. 4, 1994

[87] PCT Pub. No.: WO93/03385
PCT Pub. Date: Feb. 18, 1993

[30] Foreign Application Priority Data

Aug. 7, 1991 [DE] Germany .................. 41 26 107.0

[51] Int. Cl.6 .................... G01P 15/08; B44C 1/22
[52] U.S. Cl. .................... 73/517 AV; 73/704; 216/87; 216/39; 216/83
[58] Field of Search ........... 156/628, 643, 655, 668; 73/517 AV, 517 A, 704; 200/61.45, 61.51; 361/283, 286, 296, 297, 298

[56] References Cited

U.S. PATENT DOCUMENTS

| | | | |
|---|---|---|---|
| 2,930,863 | 3/1960 | Pasieka | 200/61.53 |
| 4,855,544 | 8/1989 | Glenn | 200/61.45 |
| 4,893,509 | 1/1990 | MacIver et al. | 73/517 AV |
| 5,025,346 | 6/1991 | Tang et al. | 361/283 |
| 5,045,152 | 9/1991 | Sickafus | 156/653 |
| 5,129,983 | 7/1992 | Greiff | 156/647 X |

FOREIGN PATENT DOCUMENTS

| | | |
|---|---|---|
| 1270543 | 6/1990 | Canada . |
| 0157663 | 10/1985 | European Pat. Off. . |
| 2923029 | 12/1980 | Germany . |
| 3727142 | 2/1989 | Germany . |
| 37 42 385.1 | 6/1989 | Germany . |

Primary Examiner—William Powell
Attorney, Agent, or Firm—Kenyon & Kenyon

[57] ABSTRACT

An acceleration sensor is used in particular for recognizing an impact experienced by a motor vehicle. The sensor has a spring-mass system (1) with at least one stable original position (4) and one stable deflection position (5). Upon acceleration in the measuring direction, the spring-mass system is initially deflected only slightly out of the original position (4). However, if a predetermined acceleration value is exceeded, then the spring-mass system (1) jumps into the deflection position (5), in which an electrical contact is closed.

15 Claims, 4 Drawing Sheets

ACCELERATION SENSOR AND PROCESS FOR ITS PRODUCTION

FIELD OF THE INVENTION

The present invention relates to an acceleration sensor and a process for producing the sensor.

BACKGROUND OF THE INVENTION

Acceleration sensors, in which an electric contact is closed through the deflection of a spring-mass system, have already been disclosed by the German Patent 29 23 029. In these sensors, the deflection of the spring-mass system is linear to the acceleration. The movement of the spring-mass system is damped to improve the switching performance of the sensor. The German Patent 37 27 142 has already disclosed processes for producing sensors by irradiating a plastic layer through a mask with X-ray radiation, dissolving out the irradiated regions, and galvanically filling the thus created negative sensor matrix with a metal.

SUMMARY OF THE INVENTION

In contrast, the advantage of the sensor according to the invention is that the spring-mass system of the sensor is not deflected until a predetermined acceleration value is exceeded. This makes it possible for the sensor signal to be evaluated quite simply. Another advantage to be considered is that the contact closing takes place very reliably and entails only negligible bouncing. Therefore, large currents can also flow through the sensor according to the invention. In addition, mechanical spring-mass systems are particularly insensitive.

The spring-mass system and the contacts are produced quite simply on an insulating, plate-shaped substrate. Because the walls of the metal structures are oriented predominantly at right angles to the substrate, the clearances among the sensor structures are precisely defined. Since the contact points are made of another material, the resistance of the contact is diminished. The properties of the springs, which are designed as bending bars, can be calculated quite simply. The desired non-linear switching performance of the spring-mass system is realized with springs that show a slight curvature. Springs, which are straight, but are not aligned parallel to one another, demonstrate the same switching performance. With the smallest degree of complexity, the sensors are able to be realized with a seismic mass between two bearing blocks and, in each case, with a spring between the bearing blocks and the seismic mass. By adding electrostatic actuators, the sensors can be switched arbitrarily through the application of a voltage. The functioning of the sensors is checked in this manner. An especially simple design of the electrostatic actuators consists of comb-shaped electrodes that mate into one another. The damping and thus the dynamic response of the sensors is influenced through the formation of a small gap between the spring-mass system and the contact block. The damping is adjusted by means of additional venting slits. The responsivity of the sensors is influenced through the application of an electric voltage between the contact block and the seismic mass.

One advantage of the process according to the invention is that the sensors are produced with small manufacturing tolerances. Another advantage to consider is the fact that the disclosed process allows a parallel production of a plurality of sensors and, thus, lowers the manufacturing costs for the individual sensors. Producing sensors by means of X-ray radiation is advantageous due to the low expenditure entailed by small series. In mass production, it is more cost-effective to mold plastic structures. The application of additional X-ray irradiation makes it possible to produce metal structures out of different materials.

DETAILED DESCRIPTION

Figure 1:
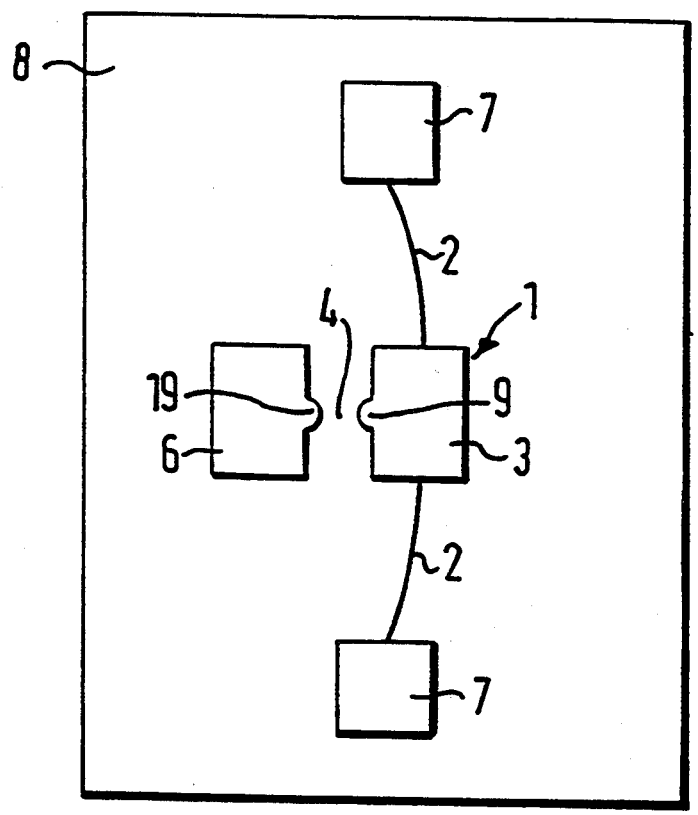
FIG. 1 shows a sensor according to the invention in the original position.
Figure 2:
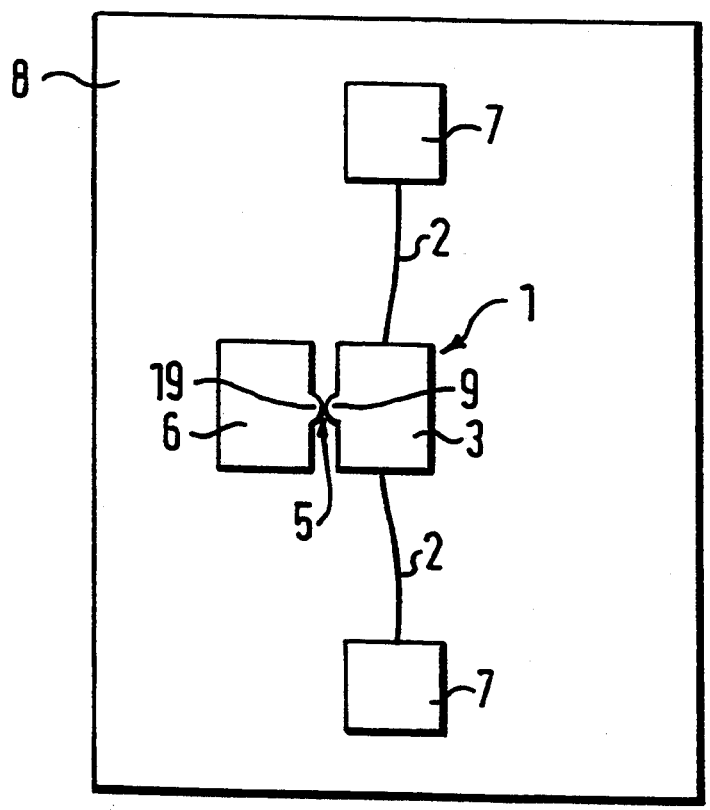
FIG. 2 a sensor in the deflection position.

In FIG. 1 and FIG. 2, 1 denotes the spring-mass system consisting of two springs 2 and one seismic mass 3. The seismic mass 3 is suspended by the springs 2 on the bearing blocks 7. At a small distance opposite the seismic mass 3 is found the contact block 6, which is designated as contact point 9, 19 at the point of contact of the seismic mass and the contact block. In FIG. 1, 4 denotes a stable original position, and in FIG. 2, 5 denotes a stable deflection position of the sensor. The original position 4 and the deflection position 5 are stable in the sense that a force is needed to remove the sensor from the respective position. The forces required to do this do not have to be the same for both positions. In particular, one can conceive of application cases in which, given very small acceleration values, the sensor returns from the deflection position to the original position again. The bearing blocks 7 and the contact block 6 are securely joined to the substrate 8. The springs 2 and the seismic mass 3 are suspended on the bearing blocks so as to allow a clearance between the substrate 8 and the springs 2 and the seismic mass 3. As a result of these measures, the movement of the spring 2 and the seismic mass 3 between the original position 4 and the deflection position 5 is not hindered by friction with the substrate 8. The contact block 6 and the bearing blocks 7 are predominantly designed as rectangular structures here. However, other refinements are also possible, provided that these structures adhere adequately to the substrate 8. The springs 2 are designed as bending bars having a considerable length in comparison to their thickness. The mass of the springs 2 is small compared to the weight of the seismic mass 3.

The seismic mass 3 is essentially designed here as a rectangular block. One can conceive of other refinements of the seismic mass. The essential feature of the seismic mass 3 here is that its weight is substantially greater than the weight of the springs 2 and that it is rigid, i.e., not deformable. The calculability of the sensor response is simplified by this partitioning into weightless, easily deformable springs 2 and a rigid, heavy seismic mass. One can just as well use sensors, in which the seismic mass and the springs are not clearly separated, and which consist, for example, of only one spring or of one spring having a thickened region to increase responsivity. However, depending on the refinement, the degree of complexity required to calculate such sensors is greater. The slight curvature of the springs 2 designed as helical springs makes it possible for a stable original position 4 and a stable deflection position 5 to be attained. The seismic mass 3 is pressed against the contact block 6 by means of the springs 2 bent in an s-shape in the deflection position 5. This force diminishes any bouncing experienced by the sensor.

Figure 3:
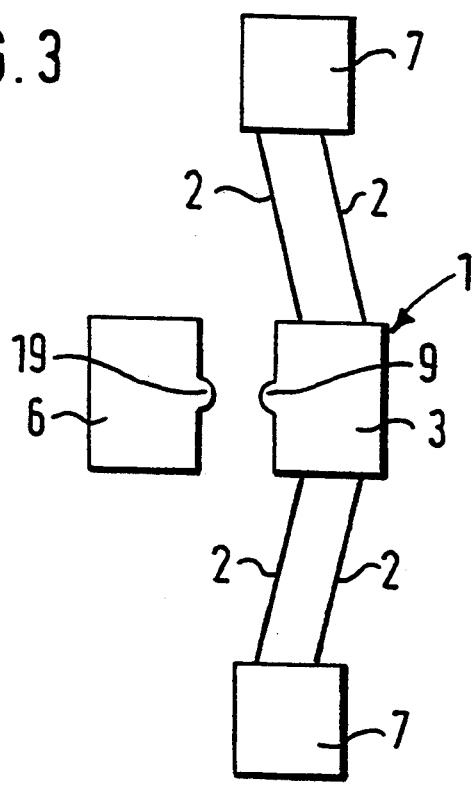
FIG. 3 a sensor with straight helical springs.

FIG. 3 depicts another specific embodiment of the sensor according to the invention. The seismic mass 3 is suspended in each case with two springs 2 between two bearing blocks 7. The seismic mass 3 is again situated opposite a contact block 6. Through the application of four springs 2, a better guidance of the seismic mass 3 is achieved when there is a change from the original position 4 into the deflection position 5. It is ensured that the seismic mass 3 can virtually only execute a rectilinear movement in the direction of the contact block 6. The springs 2 are designed as straight bending bars, the springs situated in each case on one side of the seismic mass being parallel to one another. The springs 2 on the different sides of the seismic mass 3 show a slight deviation from the parallel. As a result of this measure, a non-linear performance characteristic is achieved, as in the case of curved springs.

Figure 4:
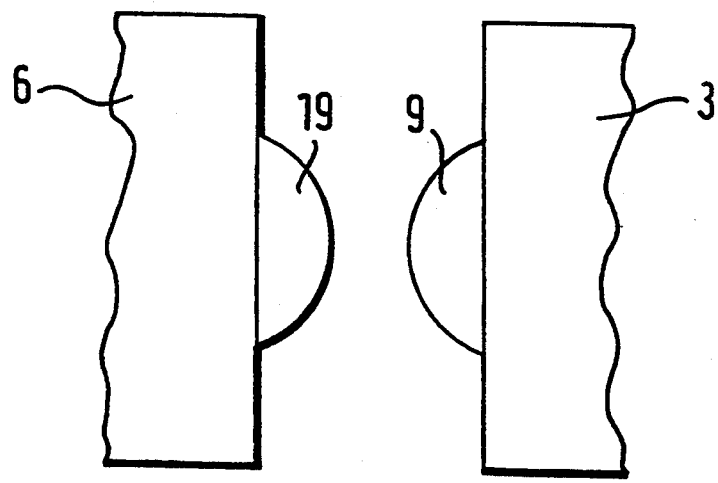
FIG. 4 the contact points.

In FIG. 4, 9 denotes the contact point on the seismic mass 3 and 19 the contact point on the contact block 6. In this example, the contact points are made of a different material, such as gold. As a result of this measure, the electrical resistance between the seismic mass 3 and the contact block 6 is diminished. Other materials or material layers can be used in a comparable manner to influence the resistance and the service life of the contact points 9, 19. The geometric shape of the contact points 9, 19 is not restricted to the circular segments shown here. Angular structures or also projections can be used in a comparable fashion on the one side and corresponding indentations on the other side.

Figure 5:
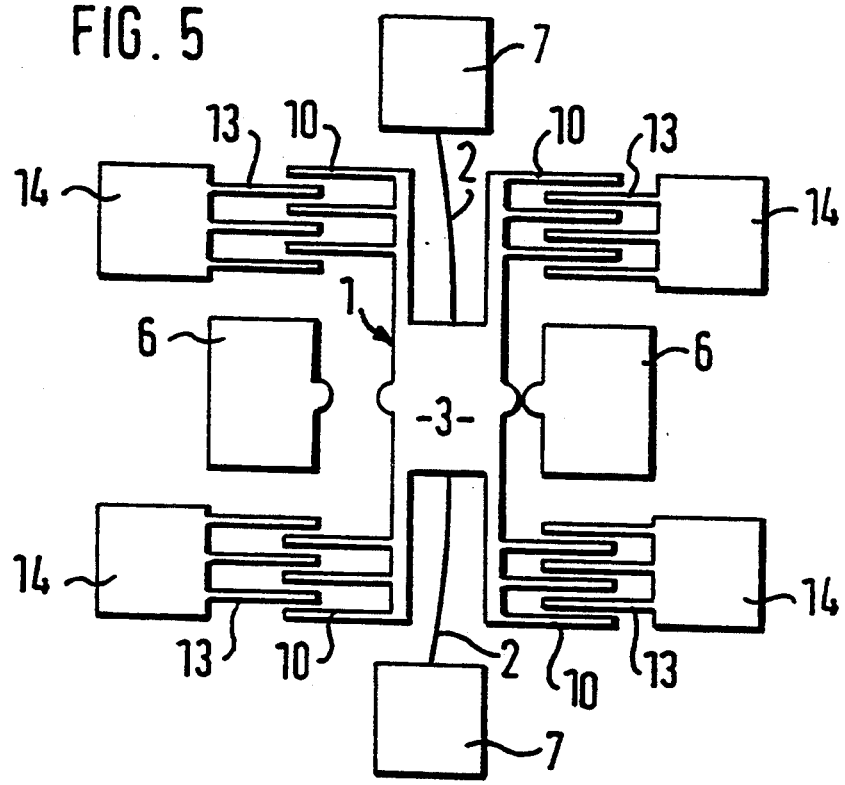
FIG. 5 a sensor with additional actuators.

FIG. 5 shows a sensor according to the invention having an electrostatic actuator. The seismic mass 3 is suspended in each case from bearing blocks 7 by one curved helical spring 2 on each side. The seismic mass 3 is arranged in the axis of motion between two contact blocks 6. The spring-mass system 1 of the sensor is provided with four electrostatic actuators 10. The actuators consist of comb-shaped, interlaced electrodes 13, which are partially mounted on the spring-mass system 1 and partially on the additional actuator-bearing blocks 14. When there is a difference in potential between the spring-mass system 1 and the bearing blocks 14, then a force that pulls the electrodes 13 into one another acts to compensate for the potential difference. By configuring the actuators 10 on both sides of the spring-mass system 1, the spring-mass system 1 can be arbitrarily switched back and forth between the two contact blocks 6. Thus, the actuators 10 enable the functioning of the sensor to be tested. It is equally possible, by applying a defined voltage to the actuators 10 on one side of the spring-mass system 1, to shift the tripping characteristic of the sensors toward lower acceleration values. If the actuators 10 are activated on the other side, then the tripping threshold of the sensors can be shifted toward higher acceleration values.

Figure 6:
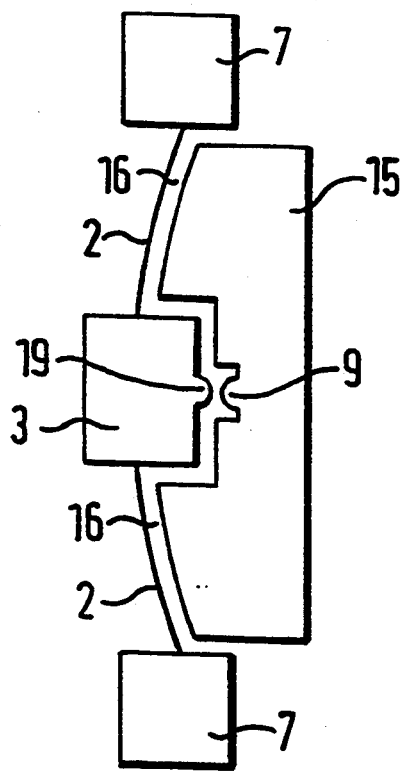
FIG. 6 a sensor with a specially designed contact block.

In FIG. 6, the refinement of the bearing blocks 7, of the springs 2 and of the seismic mass 3 is pursuant to one of the previously described manners. The contact block 15 is developed so as to allow only a small gap 16 to remain between the contact block 15 and the spring-mass system. The gap 16 is designed to be only insignificantly larger than the clearance between the contact points 9 and 19. When the spring-mass system 1 of the original position 4 jumps into the deflection position 5, then the air contained in the gap 16 is pressed out through the narrowing of the gap width. In the case of small gaps 16, the air cannot escape quickly enough, so that the movement of the spring-mass system 1 is damped. The contact points 9, 19 are prevented from bouncing, because the movement of the spring-mass system 1 is suitably damped. The tripping point of this sensor is shifted toward lower accelerations when a voltage is applied between the spring-mass system 1 and the contact block 15.

Figure 7:
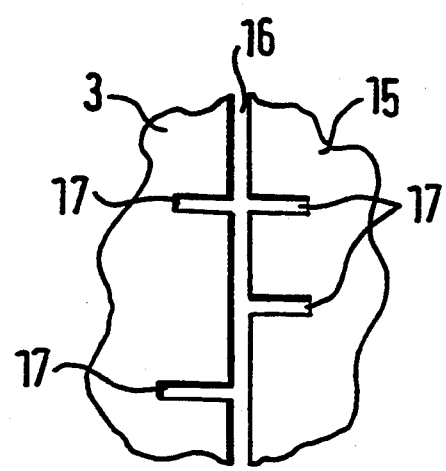
FIG. 7 a detail of the gap between the contact block and the seismic mass.

In FIG. 7, 16 denotes the gap between the seismic mass 3 and the contact block 15. The damping performance characteristics of the spring-mass system can be influenced through the introduction of venting slits, which project both into the seismic mass 3 and/or the contact block 15. The application of the venting slits 17 makes it possible to influence the damping of the spring-mass system 1 without affecting the possibility of altering the trigger point of the sensors through the application of a voltage between the seismic mass 3 and the contact block 15.

Figure 8:
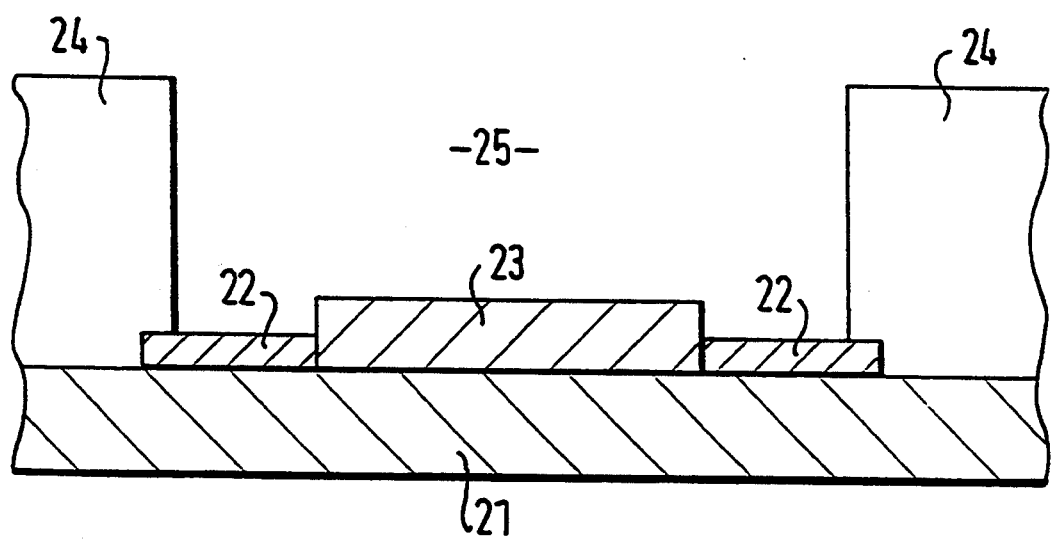
FIGS. 8 and 9 the production of the sensor.
Figure 9:
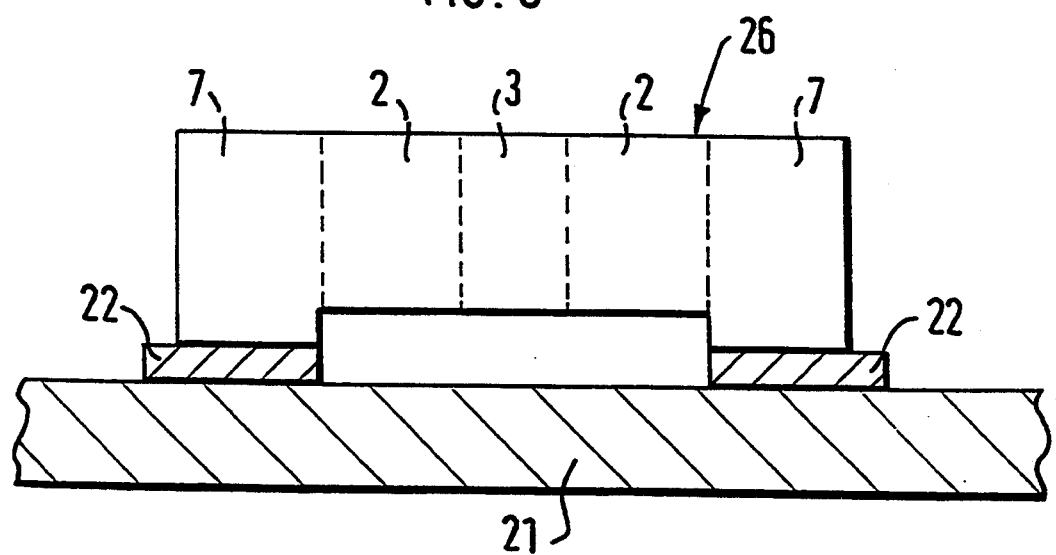

In FIG. 8, 21 designates an insulating substrate, 22 a structured, conductive layer applied to it, 23 a structured, dissolvable layer, and 24 a plastic layer having recesses 25. The various layers can overlap one another. The insulating substrate 21 consists, for example, of a silicon wafer having an insulating layer of silicon oxide or silicon nitride. Ceramic materials, such as aluminum-oxide ceramic can likewise be used. Metals are used for the conductive layer 22. These metals are applied to the substrate 21 through vapor or sputtering deposition. These layers are structured using the known masking and etching techniques of thin film technology. On the one hand, the functioning of the layers 22 consists in guaranteeing a good adherence of the sensors to the substrate 21. On the other hand, they are the electrodes used to galvanically separate the sensor structures. To meet these requirements, the layer 22 can be made up of two metal layers. To ensure a good adhesion with the substrate, chromium can be used, for example. A good electroplating electrode is achieved with gold, for example. The dissolvable layer 23 has the property of being able to be selectively dissolved in relation to the material of the substrate 21, the conductive layer 22, and the galvanically separated metal 26 of the sensor structures. Consequently, the material of the layer 23 results from the selection of the other materials used to produce the sensor. When aluminum-oxide ceramic is used for the substrate 21, a chromium-gold layer for the conductive layer 22, and nickel for the galvanic separation, then titanium can be used, for example, for the dissolvable layer 23. Titanium is selectively etched by hydrofluoric acid against all the other materials mentioned. Alternatively, the dissolvable layer 23 can consist of plastics, such as polyimide or ceramic materials, such as boron-doped glass. The plastic layer 24 is provided with recesses 25, which constitute a mold for the galvanic separation of the sensors. One way to produce the plastic layer 24 with the recesses 25 consists in applying X-ray radiation having a small divergence, as produced for example by a synchrotron. By irradiating an initially full-surface plastic layer 24 through a mask, which partially masks out the X-ray radiation, the plastic layer 24 can be irradiated so as to allow only the region of the future sensor structures to be exposed. The irradiated plastic is dissolved out selectively in relation to the non-irradiated plastic. Polymethyl methacrylate is suited, for example, as an irradiation-sensitive plastic. Another method for producing the plastic layer 24 with the recesses 25 consists in the application of molding techniques, such as injection molding or reaction molding. During the molding process, a mold is filled with the liquid or deformable plastic. After the plastic hardens in the mold, the plastic and the mold are separated. The result is a structured plastic layer 24 having recesses 25. This process is either applied to the substrate 21 or, however, the separately produced plastic layer 24 having the recesses 25 is produced separately and then joined to the substrate 21. FIG. 9 shows a cross-section through a sensor produced in this manner. The sensor structure consisting of the bearing block 7, springs 2 and the seismic mass 3 is produced on the substrate 21 through the galvanic deposition of a metal on the conductive layer 22.

The plastic layer 24 and the dissolvable layer 23 are removed. The plastic layer 24, together with the recesses 25, represents, therefore, a lost form for producing the sensors. By means of the dissolvable layer 23, the movable sensor structures, such as the springs 2 and the seismic mass 3, are separated from the substrate 21, so that they are not hindered in their movement as the result of friction with the substrate. The side walls of the thus produced sensor structures are perpendicular to the substrate. Thus, a very precise definition is produced for the sensor geometry.

What is claimed is:

1. An acceleration sensor for measuring an acceleration of a motor vehicle, comprising a spring-mass system responsive only to a component of the acceleration of the vehicle which is directed along an axis, the spring mass system including:
   a plate-shaped substrate;
   a seismic mass;
   a contact block coupled to the substrate;
   a bearing block coupled to the substrate; and
   a spring coupled between the seismic mass and the bearing block so that a clearance exists between the spring and the substrate and between the seismic mass and the substrate, wherein the seismic mass, the spring and the bearing block are integrally formed of metal and wherein the spring, the seismic mass, the bearing block and the contact block define side walls which are substantially perpendicular to a surface of the substrate;
   wherein the spring-mass system has an initial position and a deflection position in which a contact is closed between the seismic mass and the contact block, and wherein, upon an acceleration of the vehicle having a component along the axis of less than a predetermined magnitude, the spring-mass system deviates, along the axis, only slightly from the initial position and, upon an acceleration of the vehicle having a component along the axis greater than the predetermined magnitude, the spring-mass system is deflected along the axis to the deflection position and does not return to the initial position until the vehicle is subjected to an acceleration having a component along the axis greater than the predetermined magnitude and directed opposite to the previous acceleration.

2. A sensor according to claim 1, wherein one of the seismic mass and the contact block has a contact point, and wherein the contact point consists of different material than the material of which the other of the one of the seismic mass and the contact block is constructed.

3. A sensor according to claim 1, wherein the spring-mass system includes a plurality of springs and wherein the springs are formed as bending bars whose thickness is small in comparison to a length of the bending bars.

4. A sensor according to claim 3, wherein, when the spring-mass system is in the initial position, the springs are curved.

5. A sensor according to claim 4, wherein, when the spring-mass system is in the initial position, each spring is situated on a straight line, and wherein at least two springs are not parallel.

6. A sensor according to claim 5, wherein the spring-mass system includes a plurality of bearing blocks, and wherein the seismic mass is situated between the bearing blocks and is joined by a first spring to a first bearing block and is joined by a second spring to a second bearing block.

7. A sensor according to claim 1, wherein the spring-mass system includes an electrostatic actuator, which enables the spring-mass system to move from the initial position into the deflection position and from the deflection position into the initial position.

8. The sensor according to claim 7, wherein the electrostatic actuator includes comb-shaped, interlaced electrodes, which receive electric potentials.

9. A sensor according to claim 1, wherein the contact block includes a gap on a side facing one of the seismic mass and the spring, and wherein the gap between the contact block and the one of the seismic mass and the spring is slightly larger than the clearance between a contact point of the contact block and a contact point of the seismic mass.

10. A sensor according to claim 1, wherein the gap includes venting slits which project into one of the seismic mass and the contact block.

11. A sensor according to claim 10, further including means for applying an electric voltage between the contact block and one of the seismic mass and spring.

12. A process for producing an acceleration sensor for measuring an acceleration of a motor vehicle comprising the steps of:
   providing, as a substrate, an insulating plate having a structured, conductive layer and a structured, dissolvable layer;
   producing a plastic layer including a plurality of recesses on the substrate, wherein the recesses are partially situated on the dissolvable layer;
   galvanically filling the recesses with a metal; and
   thereafter, removing the plastic layer and the dissolvable layer.

13. A process according to claim 12, wherein the plastic layer including the plurality of recesses is produced by irradiating the plastic layer with X-rays and by selectively dissolving out the irradiated regions.

14. A process for producing an acceleration sensor for measuring an acceleration of a motor vehicle comprising the steps of:
   providing, as a substrate, an insulating plate having a structured, conductive layer and a structured, dissolvable layer;
   producing a plastic layer including a plurality of recesses on the substrate, wherein the recesses are partially situated on the dissolvable layer;
   galvanically filling the recesses with a metal;
   partially irradiating the plastic layer with X-ray radiation;

dissolving out the irradiated region selectively in relation to the non-irradiated region, to form a cavity;

filling the cavity with another metal; and removing the plastic layer and the dissolvable layer.

15. A process according to claim 12, wherein the plastic layer including the plurality of recesses is produced by molding plastic structures.

* * * * *